(12) United States Patent
Wang et al.

(10) Patent No.: US 11,380,747 B2
(45) Date of Patent: Jul. 5, 2022

(54) DISPLAY PANEL HAVING DIVIDED AREA SUB-PIXEL UNITS

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/454,359

(22) Filed: Jun. 27, 2019

(65) Prior Publication Data

US 2020/0144344 A1 May 7, 2020

(30) Foreign Application Priority Data

Nov. 6, 2018 (CN) .......................... 201811311226.8

(51) Int. Cl.
*H01L 27/32* (2006.01)
*H01L 33/42* (2010.01)
(Continued)

(52) U.S. Cl.
CPC ........ *H01L 27/3258* (2013.01); *H01L 27/322* (2013.01); *H01L 27/3211* (2013.01);
(Continued)

(58) Field of Classification Search
CPC ............. H01L 27/3258; H01L 27/3211; H01L 27/322; H01L 27/3244; H01L 27/3246;
(Continued)

(56) References Cited

U.S. PATENT DOCUMENTS 7,579,199 B2 * 8/2009 Suh ................... H01L 29/66969
438/22
8,188,473 B2 * 5/2012 Bang .................. H01L 51/5234
257/59
(Continued)

FOREIGN PATENT DOCUMENTS

CN 104269494 A 1/2015
CN 104362169 A 2/2015
(Continued)

OTHER PUBLICATIONS

First Office Action for Chinese Patent Application No. 201811311226.8 dated Apr. 28, 2020.
(Continued)

*Primary Examiner* — Ida M Soward
(74) *Attorney, Agent, or Firm* — Calfee, Halter & Griswold LLP

(57) ABSTRACT

The present disclosure provides a display panel, a display device, and a method for manufacturing a display panel. The display panel includes a pixel unit. The pixel unit includes a plurality of sub-pixel units. Each of the plurality of sub-pixel units includes at least one transparent film layer. Each of the plurality of sub-pixel units is divided into a light-emitting area and a light-transmitting area, and the quantity of the transparent film layer in the light-transmitting area is smaller than the quantity of the transparent film layer in the light-emitting area.

4 Claims, 9 Drawing Sheets

(51) Int. Cl.
*H01L 33/12* (2010.01)
*H01L 51/52* (2006.01)
*G02F 1/133* (2006.01)
*H01L 51/56* (2006.01)
*G02F 1/1335* (2006.01)

(52) U.S. Cl.
CPC .......... *H01L 27/3246* (2013.01); *H01L 51/56* (2013.01); *G02F 1/133514* (2013.01); *G02F 1/133519* (2021.01); *H01L 27/3244* (2013.01); *H01L 27/3248* (2013.01); *H01L 27/3262* (2013.01); *H01L 33/12* (2013.01); *H01L 33/42* (2013.01); *H01L 51/5234* (2013.01); *H01L 2227/323* (2013.01)

(58) Field of Classification Search
CPC ............. H01L 27/3248; H01L 27/3262; H01L 27/3295; H01L 33/42; H01L 33/12; G02F 1/133514; G02F 1/133519
See application file for complete search history.

(56) References Cited

U.S. PATENT DOCUMENTS

| | | | | |
|---|---|---|---|---|
| 9,123,676 | B2* | 9/2015 | Han | H01L 27/3246 |
| 9,276,230 | B2* | 3/2016 | Kim | H01L 27/3276 |
| 9,412,801 | B2* | 8/2016 | Choi | H01L 27/3262 |
| 9,947,898 | B2* | 4/2018 | Kim | H01L 27/3276 |
| 10,096,662 | B2* | 10/2018 | Choi | H01L 51/56 |
| 10,236,309 | B2* | 3/2019 | Kim | H01L 27/1262 |
| 10,403,847 | B2* | 9/2019 | Chung | H01L 51/56 |
| 10,692,946 | B2* | 6/2020 | Yamada | H01L 27/3211 |
| 10,833,138 | B2* | 11/2020 | Nendai | H01L 51/5275 |
| 11,004,922 | B2* | 5/2021 | You | H01L 51/5225 |
| 2004/0135945 | A1* | 7/2004 | Choi | G02F 1/13394 349/114 |
| 2004/0252262 | A1* | 12/2004 | Park | G02F 1/133555 349/114 |
| 2005/0142678 | A1* | 6/2005 | Kim | G02F 1/133553 438/30 |
| 2007/0099318 | A1* | 5/2007 | Chang | G02F 1/133553 438/22 |
| 2007/0146592 | A1* | 6/2007 | Kimura | G02F 1/1333 349/114 |
| 2013/0009162 | A1* | 1/2013 | Kang | H01L 27/3246 257/72 |
| 2013/0313539 | A1 | 11/2013 | Ha et al. | |
| 2015/0001501 | A1* | 1/2015 | Cho | H01L 51/5246 257/40 |
| 2015/0076456 | A1* | 3/2015 | Choi | H01L 27/3267 438/34 |
| 2015/0097171 | A1* | 4/2015 | Kim | H01L 27/326 257/40 |
| 2016/0064421 | A1* | 3/2016 | Oh | H01L 27/1218 257/43 |
| 2016/0111487 | A1* | 4/2016 | Jeong | H01L 27/3279 257/40 |
| 2016/0126494 | A1 | 5/2016 | Jung et al. | |
| 2016/0148982 | A1 | 5/2016 | Ma et al. | |
| 2016/0254455 | A1 | 9/2016 | Wang | |
| 2016/0370655 | A1 | 12/2016 | Nagayama et al. | |
| 2017/0092894 | A1* | 3/2017 | Yang | H01L 27/326 |
| 2017/0148860 | A1* | 5/2017 | Park | H01L 27/3248 |
| 2017/0179438 | A1 | 6/2017 | Xu | |
| 2018/0145118 | A1* | 5/2018 | Kim | G09G 3/3258 |
| 2018/0342568 | A1* | 11/2018 | Jin | H01L 27/3262 |
| 2018/0358425 | A1* | 12/2018 | Lee | G09G 3/3233 |
| 2018/0366586 | A1* | 12/2018 | Son | H01L 27/3276 |
| 2019/0088730 | A1* | 3/2019 | Lee | H01L 51/5228 |
| 2019/0095007 | A1* | 3/2019 | Jeong | G06F 3/0446 |
| 2019/0207149 | A1 | 7/2019 | Yu | |
| 2019/0245020 | A1* | 8/2019 | Choi | G09G 3/20 |
| 2020/0013849 | A1* | 1/2020 | Kim | H01L 27/3276 |

FOREIGN PATENT DOCUMENTS

| | | |
|---|---|---|
| CN | 104536198 A | 4/2015 |
| CN | 105097878 A | 11/2015 |
| CN | 105575997 A | 5/2016 |
| CN | 108172605 A | 6/2018 |
| CN | 108198838 A | 6/2018 |

OTHER PUBLICATIONS

Second Office Action for Chinese Patent Application No. 201811311226.8 dated Jun. 11, 2020.

* cited by examiner

DISPLAY PANEL HAVING DIVIDED AREA SUB-PIXEL UNITS

CROSS REFERENCE TO RELATED APPLICATIONS

The present application claims the priority of Chinese Patent Application No. 201811311226.8 filed on Nov. 6, 2018, the entire content of which is incorporated herein by reference in its entirety.

FIELD

The present application relates to the field of display technologies, and in particular, to a display panel, a display device, and a method for manufacturing a display panel, and more particularly to a transparent display panel, a transparent display device, and a method for manufacturing a transparent display panel.

BACKGROUND

Transparent display devices have gained broad market prospects with their novel user experience. However, the transparency of the conventional transparent display panel and the transparent display device including the panel is poor, which makes the transparent display device less competitive and hinders the commercialization of the transparent display device.

SUMMARY

According to an exemplary embodiment, there is provided a display panel, comprising a pixel unit, the pixel unit comprising a plurality of sub-pixel units, each of the plurality of sub-pixel units comprising at least one transparent film layer, wherein each of the plurality of sub-pixel units is divided into a light-emitting area and a light-transmitting area, and the quantity of the transparent film layer in the light-transmitting area is smaller than the quantity of the transparent film layer in the light-emitting area.

In some exemplary embodiments, the at least one transparent film layer comprises: a buffer layer on a first base substrate, an interlayer insulating layer in a thin film transistor on a side of the buffer layer facing away from the first base substrate, a first protective layer on a side of the thin film transistor facing away from the buffer layer, a planarization layer on a side of the first protective layer facing away from the interlayer insulating layer, a pixel defining layer on a side of the planarization layer facing away from the first protective layer, wherein the pixel defining layer defines the light-emitting area, and a light-emitting layer and a transparent electrode of an electroluminescent device on a side of the thin film transistor facing away from the first base substrate, wherein the electroluminescent device is electrically connects to the thin film transistor and the transparent electrode is on a side of the light-emitting layer facing away from the thin film transistor, wherein at least one of the buffer layer, the interlayer insulating layer, the first protective layer, the planarization layer, the pixel defining layer and the light-emitting layer is confined to the light-emitting area and excluded from the light-transmitting area.

In some exemplary embodiments, the interlayer insulating layer, the first protective layer, the planarization layer and the pixel defining layer are confined to the light-emitting area and excluded from the light-transmitting area, and the transparent electrode, the light-emitting layer and the buffer layer are disposed in both of the light-emitting area and the light-transmitting area. In some exemplary embodiments, the interlayer insulating layer, the first protective layer, the planarization layer, the pixel defining layer and the light-emitting layer are confined to the light-emitting area and excluded from the light-transmitting area, and the transparent electrode and the buffer layer are disposed in both of the light-emitting area and the light-transmitting area.

In some exemplary embodiments, at least a part of the plurality of sub-pixel units further comprises a color filter in the light-emitting area.

In some exemplary embodiments, the plurality of sub-pixel units comprises a red sub-pixel unit, a blue sub-pixel unit, and a green sub-pixel unit, the light-emitting layers of the plurality of sub-pixel units are blue light-emitting layers, the red sub-pixel unit comprises a red color filter, the green sub-pixel unit comprises a green color filter, and the blue sub-pixel unit lacks a color filter.

In some exemplary embodiments, the red color filter comprises a red light quantum dot color filter and the green color filter comprises a green light quantum dot color filter.

In some exemplary embodiments, the plurality of sub-pixel units comprises a red sub-pixel unit, a blue sub-pixel unit, and a green sub-pixel unit, the light-emitting layers of the plurality of sub-pixel units are white light-emitting layers, the red sub-pixel unit comprises a red color filter, the blue sub-pixel unit comprises a blue color filter, and the green sub-pixel unit comprises a green color filter.

In some exemplary embodiments, the red color filter comprises a red light quantum dot color filter, the green color filter comprises a green light quantum dot color filter, and the blue color filter lacks a quantum dot material.

In some exemplary embodiments, the pixel unit further comprises: a second base substrate on which the color filter is disposed, a black matrix disposed on a same layer with the color filter, wherein the black matrix and the color filter are disposed on a same side of the second base substrate, a second protective layer on a side of the second base substrate facing the first base substrate, wherein the second protective layer covers the black matrix and the color filter, a post spacer on a side of the second protective layer facing the first base substrate, and an auxiliary electrode on a side of the second protective layer facing the first base substrate, wherein the auxiliary electrode covers the post spacer and is electrically connected to the transparent electrode.

According to another exemplary embodiment, there is provided a display device, comprising the display panel according to any one of the embodiments of the present application.

According to yet another exemplary embodiment, there is provided a method for manufacturing a display panel, the display panel comprising a pixel unit, the pixel unit comprising a plurality of sub-pixel units, each of the plurality of sub-pixel units comprising at least one transparent film layer and being divided into a light-emitting area and a light-transmitting area, and the quantity of the transparent film layer in the light-transmitting area being smaller than the quantity of the transparent film layer in the light-emitting area, the method comprising:

providing a first base substrate, forming a buffer layer on the first base substrate, forming a thin film transistor on a side of the buffer layer facing away from the first base substrate, wherein the thin film transistor comprises an interlayer insulating layer, forming a first protective layer on a side of the thin film transistor facing away from the buffer layer, forming a planarization layer on a side of the first protective layer facing away from the interlayer insulating layer, forming a pixel defining layer on a side of the planarization layer facing away from the first protective layer, wherein the pixel defining layer defines the light-emitting area, and forming a light-emitting layer and a transparent electrode of an electroluminescent device on a side of the thin film transistor facing away from the first base substrate, wherein the electroluminescent device is electrically connected to the thin film transistor and the transparent electrode is on a side of the light-emitting layer facing away from the thin film transistor, wherein at least one of the buffer layer, the interlayer insulating layer, the first protective layer, the planarization layer, the pixel defining layer, and the light-emitting layer is confined to the light-emitting area and excluded from the light-transmitting area.

In some exemplary embodiments, the plurality of sub-pixel units comprises a red sub-pixel unit, a blue sub-pixel unit, and a green sub-pixel unit, the light-emitting layers of the plurality of sub-pixel units are blue light-emitting layers, the red sub-pixel unit comprises a red color filter, the green sub-pixel unit comprises a green color filter, and the blue sub-pixel unit lacks a color filter, and the method further comprises:

providing a second base substrate, forming a black matrix on the second base substrate, forming the red color filter in the red sub-pixel unit on the second base substrate and forming the green color filter in the green sub-pixel unit on the second base substrate, wherein the red color filter and the green color filter are placed on a same layer as the black matrix, forming a second protective layer on the black matrix, the red color filter, the green color filter, and a section of the second base substrate corresponding to the blue sub-pixel unit, forming a post spacer on a side of the second protective layer facing away from the second base substrate, and forming an auxiliary electrode on a side of the second protective layer facing away from the second base substrate, wherein the auxiliary electrode covers the post spacer.

BRIEF DESCRIPTION OF DRAWINGS

In order to more clearly illustrate the technical solutions in the embodiments of the present application, the drawings used to describe the embodiments will be briefly described below. The provided drawings only show a part of the embodiments of the present application. Those skilled in the art will readily recognize other embodiments based on these drawings and the description provided herein.

DETAILED DESCRIPTION

In order to solve the technical problem of poor transparency of a transparent display device, a common solution is to reduce the area of the light-emitting area. However, this causes the transparent display panel to have reduced luminous efficiency, which affects the user experience.

Figure 1:
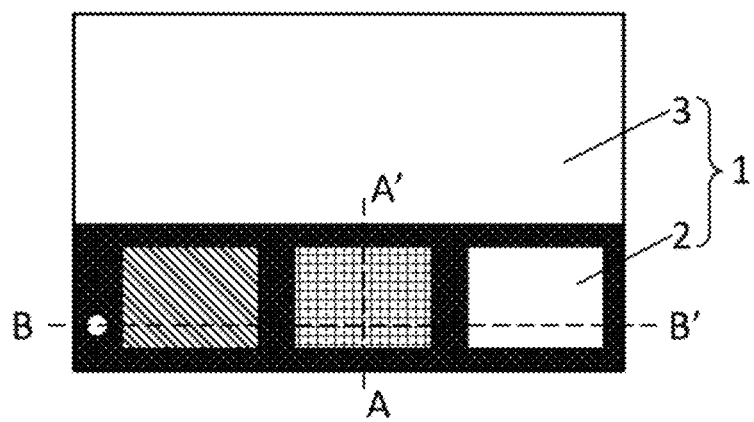
FIG. 1 schematically shows a top view of a pixel unit in the display panel according to an exemplary embodiment.
Figure 2:
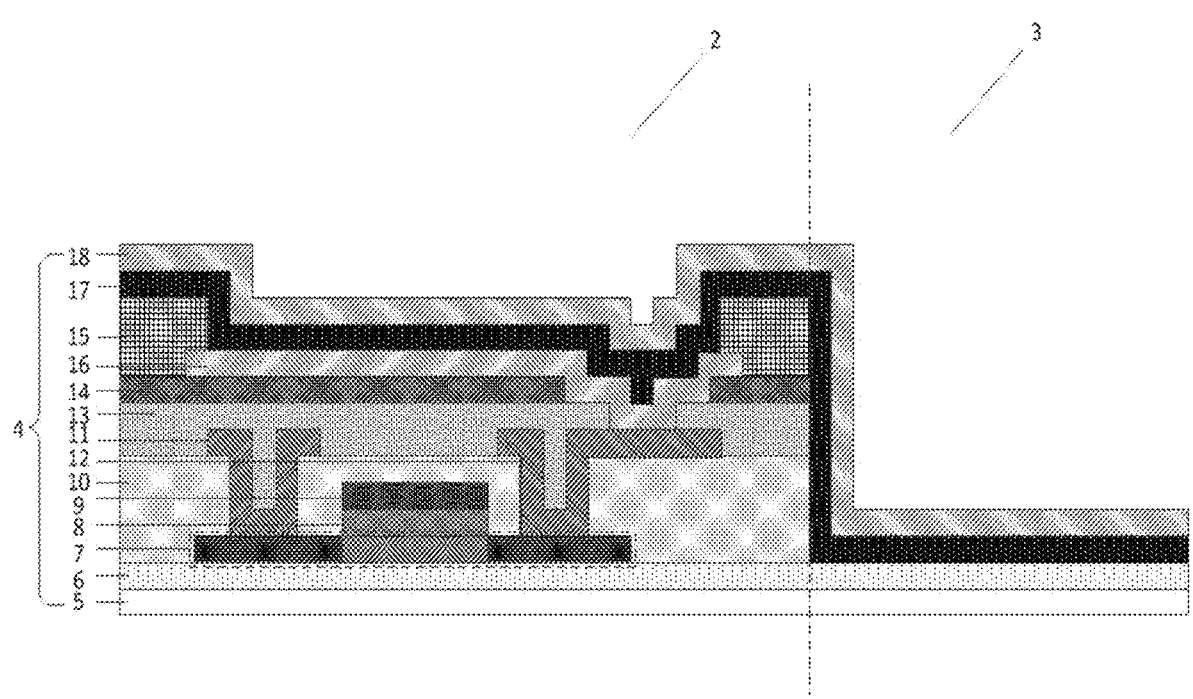
FIG. 2 schematically shows a cross-sectional view of the first substrate of a sub-pixel unit in the display panel according to an exemplary embodiment.
Figure 3:
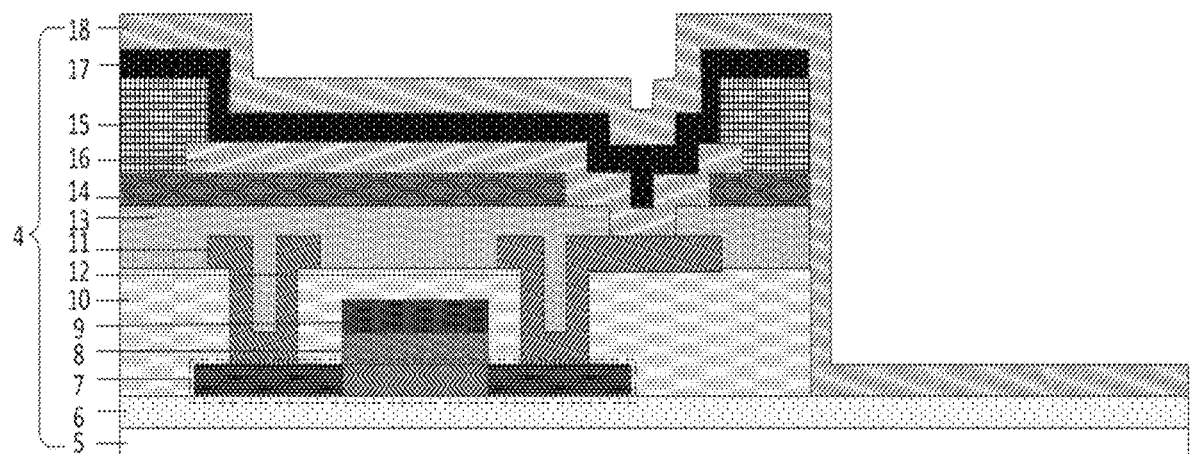
FIG. 3 schematically shows a cross-sectional view of the first substrate of a sub-pixel unit in the display panel according to another exemplary embodiment.

The present disclosure provides a sub-pixel unit and a pixel unit comprising a plurality of the sub-pixel units. FIG. 1 schematically illustrates a top view of a pixel unit of a display panel in accordance with an exemplary embodiment. FIG. 2 schematically illustrates a cross-sectional view of a pixel unit in accordance with an exemplary embodiment. FIG. 3 schematically illustrates a cross-sectional view of a pixel unit in accordance with another exemplary embodiment. Specifically, FIG. 2 and FIG. 3 show cross-sectional views of the pixel units along the AA' direction depicted in FIG. 1. The sub-pixel unit 1 comprises at least one transparent film layer. The sub-pixel unit 1 is divided into a light-emitting area 2 and a light-transmitting area 3. The quantity of transparent film layers in the light-transmitting area 3 is smaller than the quantity of transparent film layers in the light-emitting area 2. The term "transparent film layer" means a film layer having a light transmittance of at least 30%, such as at least 60%, at least 80%, or even 90%, of the light incident thereto.

In the sub-pixel unit of a common transparent display panel, the transparent film layers are usually formed in both the light-emitting area and the light-transmitting area, taking into account the process complexity and cost. However, the transparent film layer in the light-transmitting area affects the light transmittance of the light-transmitting area. In view of the limited role of some transparent film layers, especially the inorganic insulating transparent film layer, in the light-transmitting area, the present disclosure proposes to confine the transparent film layer originally existing in both the light-emitting area and the light-transmitting area to the light-emitting area and excluded from the light-transmitting area. That is to say, some transparent film layers that originally exist in both the light-emitting area and the light-transmitting area now exist only in the light-emitting area and do not exist in the light-transmitting area. Therefore, the quantity of transparent film layers in the light-transmitting area is smaller than the quantity of transparent film layers in the light-emitting area. The light-transmitting area of the sub-pixel unit according to an exemplary embodiment has a higher transmittance, comparing with the case where the transparent film layer exists in both the light-emitting area and the light-transmitting area. Also, since the area of the light-emitting area is not changed, the luminous efficiency of the light-emitting area of the sub-pixel unit of the present disclosure is not reduced. Therefore, the transparent display panel comprising the sub-pixel unit or the pixel unit of the present disclosure has an improved light transmittance of the light-transmitting area without affecting the luminous efficiency of the light-emitting area, thereby improving the transmittance of the transparent display panel and improving the user experience.

The sub-pixel unit includes a first substrate 4. In some exemplary embodiments, the first substrate 4 may be an array substrate. The first substrate 4 includes: a first base substrate 5, a buffer layer 6 located on the first base substrate 5, a thin film transistor located above the buffer layer 6 (i.e., located on a side of the buffer layer 6 facing away from the first base substrate 5), and an electroluminescent device located above the thin film transistor (i.e., located on a side of the thin film transistor facing away from the first base substrate 5). The electroluminescent device is electrically connected to the thin film transistor. The thin film transistor includes: an active layer 7, a gate insulator (GI) 8, a gate electrode (gate) 9, an interlayer insulating layer 10, a source 11 and a drain 12. The electroluminescent device includes a first electrode, a second electrode, and a light-emitting layer 17 sandwiched between the first electrode and the second electrode. In some exemplary embodiments, the second electrode is a transparent electrode and the second electrode is farther from the first base substrate 5 than the first electrode. In some exemplary embodiments, the first electrode includes an anode 16, the second electrode includes a cathode, in particular a transparent cathode 18. The first substrate 4 further includes: the first protective layer (which can also be called PVX) 13, the planarization layer 14 and the pixel defining layer (PDL) 15. The pixel defining layer 15 defines a light-emitting area 2.

In some exemplary embodiments, in the light-emitting area 2, the transparent film layers in the first substrate include a buffer layer 6, an interlayer insulating layer 10, the first protective layer 13, a planarization layer 14, a pixel defining layer 15, a light-emitting layer 17, and the transparent cathode 18. The first protective layer 13 may be a passivation layer, such as an inorganic passivation layer, the material of which may include a resin. At least one of the buffer layer, the interlayer insulating layer, the first protective layer, the planarization layer, the pixel defining layer, and the light-emitting layer are confined to the light-emitting area and excluded by the light-transmitting area. In exemplary embodiments, since the light-emitting area is defined by the pixel defining layer, the term such as "a layer confined to the light-emitting area" means that the orthographic projection of the layer on the first base substrate is surrounded by an orthographic projection of the periphery of pixel defining layer on the first base substrate. The term such as "a layer is excluded from the light-transmitting area" means that the layer is absent in the light-transmitting area. Therefore, the quantity of the transparent film layers in the light-transmitting area 3 is smaller than the quantity of the transparent film layers in the light-emitting area 2, so that the transmittance of the light-transmitting area can be improved. In some exemplary embodiments, at least one of the interlayer insulating layer, the first protective layer, the planarization layer, and the pixel defining layer is confined to the light-emitting area and excluded from the light-transmitting area. The light-emitting layer, the transparent electrode, and the buffer layer are disposed in both the light-emitting area and the light-transmitting area. More specifically, for example, in some exemplary embodiments, e.g. as shown in FIG. 2, among the above transparent film layers, only the buffer layer 6, the light-emitting layer 17, and the transparent cathode 18 extend to the light-transmitting area 3. In some exemplary embodiments, at least one of the interlayer insulating layer, the first protective layer, the planarization layer, the pixel defining layer, and the light-emitting layer is confined to the light-emitting area and excluded by the light-transmitting area, and the transparent electrode and the buffer layer are disposed in both the light-emitting area and the light-transmitting area. More specifically, for example, in some exemplary embodiments, e.g. as shown in FIG. 3, among the above transparent film layers, only the buffer layer 6 and the transparent cathode 18 extend to the light-transmitting area 3, such that the transmittance of the light-transmitting area can be further improved. In other exemplary embodiments, among the above transparent film layers, only the transparent cathode 18 extends into the light-transmitting area 3, and even the transparent cathode 18 does not extend into the light-transmitting area 3, that is, all of the above transparent film layers are confined to the light-emitting area 2.

In some exemplary embodiments, the light-transmitting area 3 retains the buffer layer 6 so that the first base substrate 5 can be protected from damage. Of course, the transparent film layers in the light-transmitting area 3 can also be selected according to actual needs and process conditions.

The ratio of the total area of the light-transmitting area of the transparent display panel according to the present disclosure to the total area of the transparent display panel can be, for example, more than 60%.

In some exemplary embodiments, as shown in FIG. 2, the thin film transistor in the sub-pixel unit may be a top-gate style thin film transistor. In other exemplary embodiments, the thin film transistor may adopt a bottom-gate structure. For example, the thin film transistor may be a Back Channel Etch (BCE) thin film transistor or an Etch Stop Layer (ESL) thin film transistor, etc. The material of the active layer 7 can be, for example, an oxide, a silicon material or an organic material. Specifically, the material of the active layer may include, for example, amorphous Indium Gallium Zinc Oxide (a-IGZO), zinc oxynitride (ZnON), and Indium Zinc Tin Oxide (IZTO), amorphous silicon (a-Si), polycrystalline silicon (p-Si), low temperature polycrystalline silicon (LT p-Si), hexathiophene, polythiophene, and the like. The material of each electrode and its lead may be a single layer of metal material such as silver (Ag), copper (Cu), aluminum (Al), molybdenum (Mo), etc., or a single layer of metal alloy material such as aluminum-niobium alloy (AlNd), Molybdenum-niobium alloy (MoNb), etc., or a stacked structure of multiply layers of metal or alloy, such as MoNb/Cu/MoNb, or a stack structure formed by a metal and a transparent conductive oxide (such as indium tin oxide (ITO), aluminum zinc oxide (AZO) etc.), such as Mo/AlNd/ITO, ITO/Ag/ITO, or the like. The material of the transparent film layer of the buffer layer, the gate insulating layer, the interlayer insulating layer, the first protective layer, etc. may be, for example, conventional insulating materials such as silicon oxide ($SiO_x$), silicon nitride ($SiN_x$), silicon oxynitride (SiON), or various new types of organic insulating materials, or high dielectric constant materials such as aluminum oxide ($AlO_x$), niobium oxide ($HfO_x$), niobium oxide ($TaO_x$), and the like. The material of the planarization layer having a planarization effect may be, for example, a polysiloxane type, an acrylic type or a polyimide type material.

According to another exemplary embodiment, there is provided a pixel unit including a plurality of sub-pixel units, wherein at least a part of the sub-pixel units further includes a color filter in its the light-emitting area.

Figure 4:
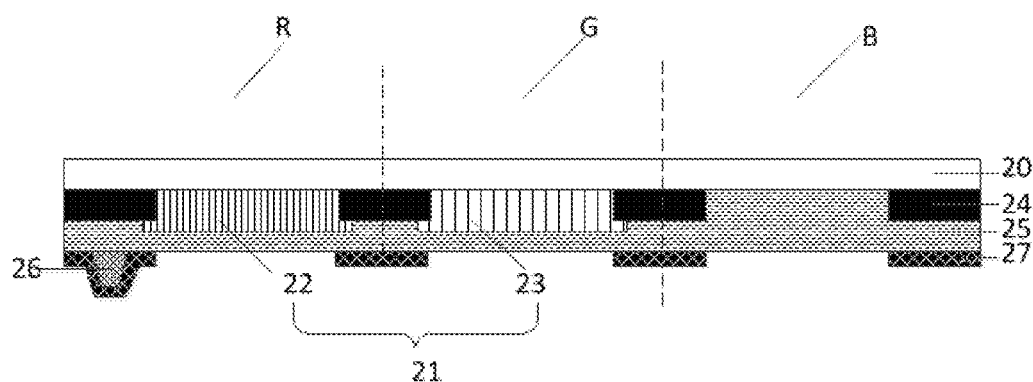
FIG. 4 schematically shows a cross-sectional view of the second substrate of a sub-pixel unit in the display panel according to an exemplary embodiment.
Figure 5:
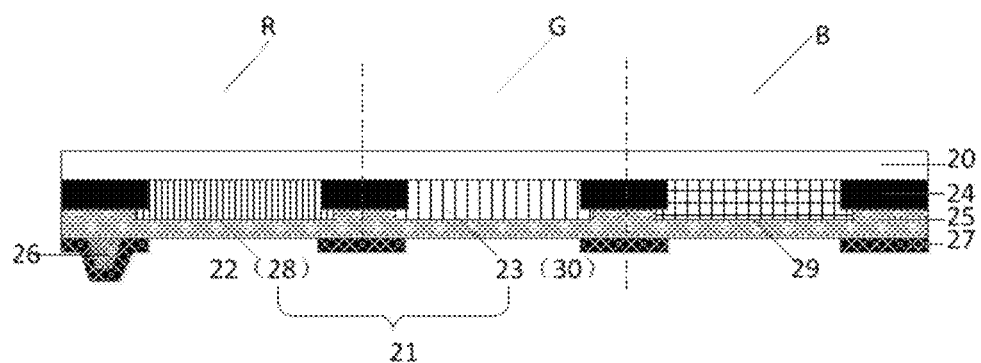
FIG. 5 schematically shows a cross-sectional view of the second substrate of a sub-pixel unit in the display panel according to another exemplary embodiment.

The sub-pixel unit further includes a second substrate 19 opposite the first substrate 4. FIG. 4 and FIG. 5 schematically show cross-sectional views of the second substrate. The structure of the second substrate in the transparent display panel according to an exemplary embodiment of the present application will be exemplified below Optionally, in the sub-pixel units, the first substrates include only one kind of light-emitting layer. The second substrate includes a second base substrate 20. In a portion of the sub-pixel units, the second substrate further includes a color filter 21 on a side of the second base substrate 20 facing the first substrate. The color filter is located in the light-emitting area of the sub-pixel. The color filter is configured to convert the wavelength of light emitted by the light-emitting layer such that the light emitted by the light-emitting layer is adjusted to a specific wavelength after passing through the color filter. That is, when the first substrate is an array substrate, the second substrate functions as a color filter substrate.

FIG. 4 schematically shows a cross-sectional view of the second substrate of a pixel unit taken along the line BB' in FIG. 1. As shown in FIG. 4, the plurality of sub-pixel units includes a red sub-pixel unit R, a blue sub-pixel unit B, and a green sub-pixel unit G. The light-emitting layers are blue light-emitting layers. The red sub-pixel unit R includes a red color filter 22, such as a red light quantum dot color filter. The green sub-pixel unit G includes a green color filter 23, such as a green light quantum dot color filter. The red light quantum dot color filter refers to the red color filter to which the quantum dot material is added. The green light quantum color means the green color filter to which the quantum dot material is added. The blue sub-pixel unit B does not need to include a color filter.

Since the light-emitting layer is a blue light-emitting layer, the light-emitting area of the blue sub-pixel can emit blue light without setting a color filter. This improves the luminous efficiency of the blue light of the transparent display panel, while also simplifying the process of making the transparent display panel. The red color filter and green color filter use quantum dot color filters to improve color purity and widen the color gamut of the display panel.

In other exemplary embodiments, the light-emitting layer in the first substrate may also be a red light-emitting layer or a green light-emitting layer. Correspondingly, when the light-emitting layer is a red light-emitting layer, the blue sub-pixel unit includes a blue light quantum dot color filter, the green sub-pixel unit includes a green light quantum dot color filter, and the red sub-pixel unit does not include a color filter. When the light-emitting layer is a green light-emitting layer, the blue sub-pixel unit includes a blue light quantum dot color filter, the red sub-pixel unit includes a red light quantum dot color filter, and the green sub-pixel unit does not include a color filter.

FIG. 5 schematically shows a cross-sectional view of the second substrate of another pixel unit taken along the line BB' in FIG. 1. The pixel unit includes a red sub-pixel unit R, a blue sub-pixel unit B, and a green sub-pixel unit G. The light-emitting layers of the sub-pixel units are white light-emitting layers. The red sub-pixel unit R includes a red color filter 28. The blue sub-pixel unit B includes a blue color filter 29. The green sub-pixel unit G includes a green color filter 30. Since the light-emitting layer of each sub-pixel unit is a white light-emitting layer, the brightness and lifetime of the display panel can be improved.

Optionally, the red color filter 28 includes a red light quantum dot color filter 22, and the green color filter 30 includes a green light quantum dot color filter 23, thereby further improving the color purity and widening the color gamut of the display panel. FIG. 5 shows the example in which the red color filter is the red light quantum dot color filter and the green color filter is the green light quantum dot color filter. Of course, in a specific implementation, a quantum dot color filter may also be formed on a color filter that does not contain a quantum dot material.

In some exemplary embodiments, the blue color filter corresponding to the blue sub-pixel unit does not contain a quantum dot material, thereby ensuring the blue light efficiency.

In some exemplary embodiments, the second substrate 19 further includes a second base substrate 20. The color filter is disposed on the second base substrate 20. The second substrate further includes a black matrix 24 disposed in the same layer as the color filter, a second protective layer 25 on a side of the second base substrate 20 facing the first base substrate, a post spacer 26 located at a side of the second protective layer facing the first base substrate, and an auxiliary electrode 27 on a side of the second protective layer 25 facing the first base substrate, wherein the auxiliary electrode and the transparent electrode are electrically connected. Due to the contact between the auxiliary electrode and the transparent cathode, the resistance of the transparent cathode can be reduced. The position of the auxiliary electrode corresponds to the black matrix. For example, in the perspective of FIG. 1, the shape of the auxiliary electrode may be the shape of a standing ladder being rotated for 90 degree. The post spacer is used to protrude the auxiliary electrode toward the first substrate to facilitate the connection with the transparent electrodes of the first substrate. In the present application, the term such as "disposed/placed on the same layer" does not mean that the upper surfaces (or the lower surfaces) of the two elements defined by it are aligned. It only requires at least one of the upper surface and lower surface of one element is between the upper surface and the lower surface of the other element in the direction away from the substrate.

In some exemplary embodiments, in case the sub-pixel units include the same light-emitting layers, the light-emitting layers can be integrated to form a continuous layer of light-emitting layer. For example, in a pixel unit, the continuous layer of light-emitting layer is formed across the light-emitting areas of three sub-pixels.

In other exemplary embodiments, each sub-pixel unit may include an individual light-emitting layer, that is, the first substrate may also include multiple light-emitting layers. For example, the red sub-pixel unit includes a red light-emitting layer, the blue sub-pixel unit includes a blue light-emitting layer, and the green sub-pixel unit includes a green light-emitting layer. In this case, the second substrate does not need to include a color filter.

Figure 6:
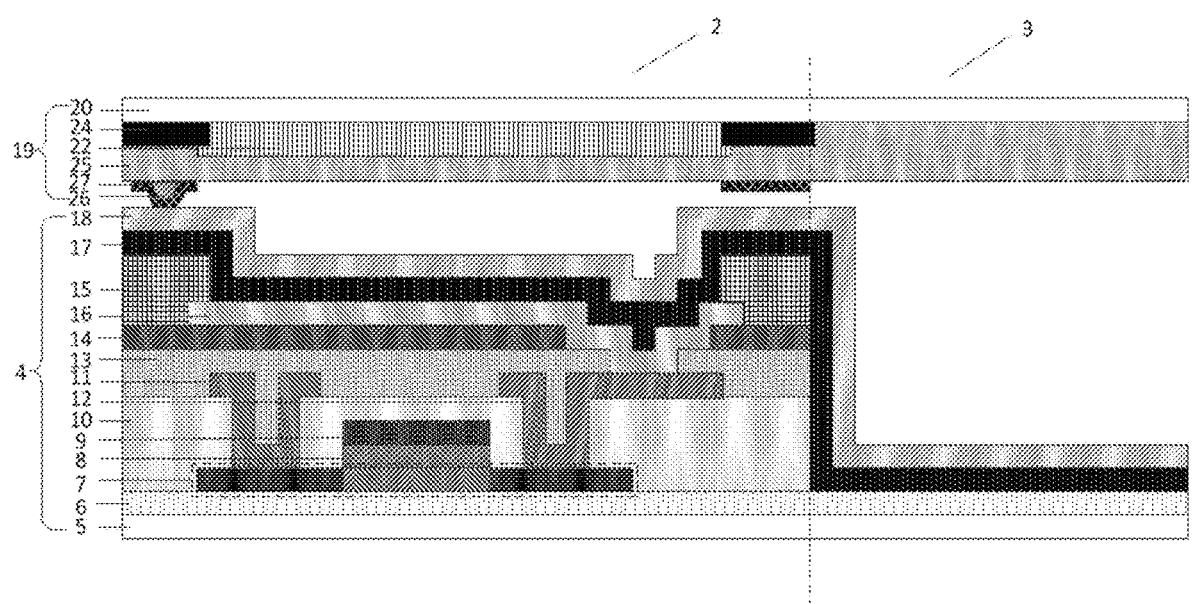
FIG. 6 schematically shows a cross-sectional view of a sub-pixel unit in the display panel according to an exemplary embodiment.

FIG. 6 schematically shows a cross-sectional view of the sub-pixel unit after the first substrate and the second substrate are assembled. As shown in FIG. 6, the auxiliary electrode is connected to the transparent electrode with the help of the post spacer. The segments of the auxiliary electrode that are not placed on the post spacer generally do not directly touch the transparent electrode, but configured to conduct the electrical potential.

In accordance with another exemplary embodiment, there is provided a transparent display panel, comprising a pixel unit in accordance with any of the embodiments.

In accordance with yet another exemplary embodiment, there is provided a transparent display device, comprising a transparent display panel in accordance with any of the embodiments.

Figure 7:
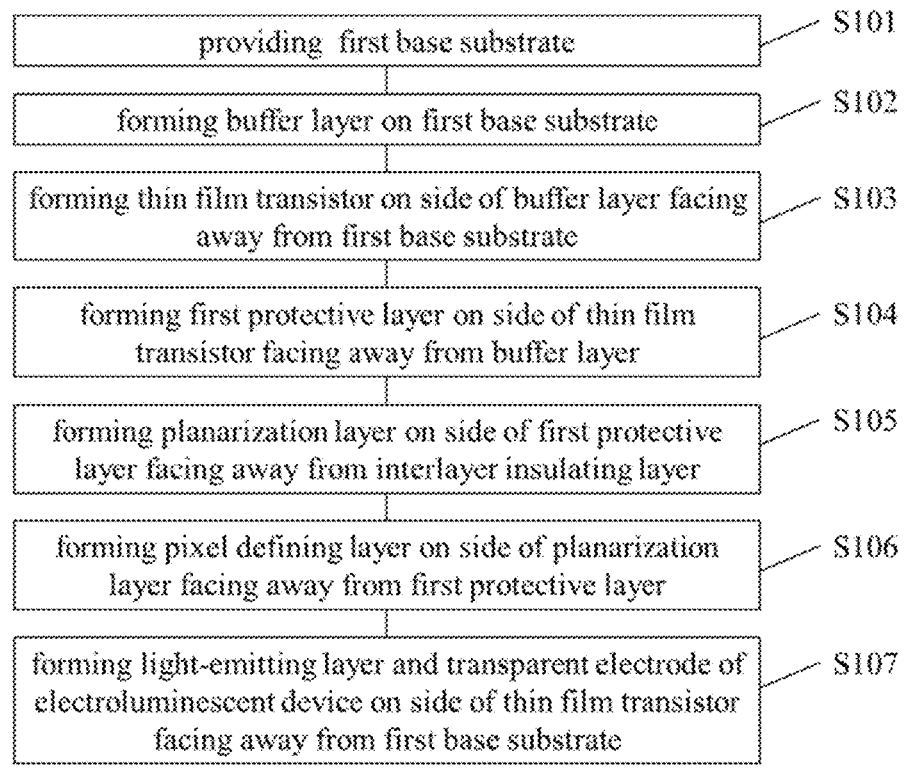
FIG. 7 schematically shows a flow chart of a method for manufacturing a display panel according to an exemplary embodiment.
Figure 8A:
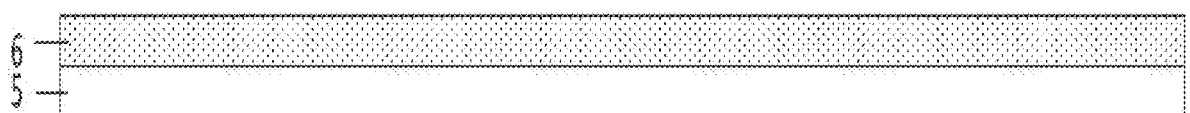
FIGS. 8A-8K schematically show the intermediate structures of the first substrate in the process of manufacturing the display panel according to an exemplary embodiment.
Figure 8B:
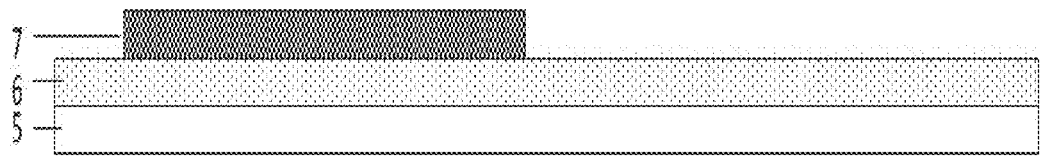
Figure 8C:
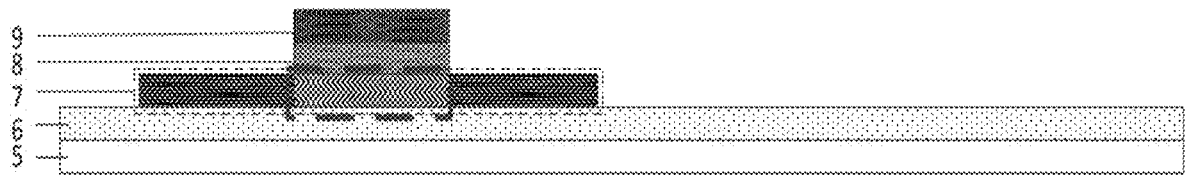
Figure 8D:
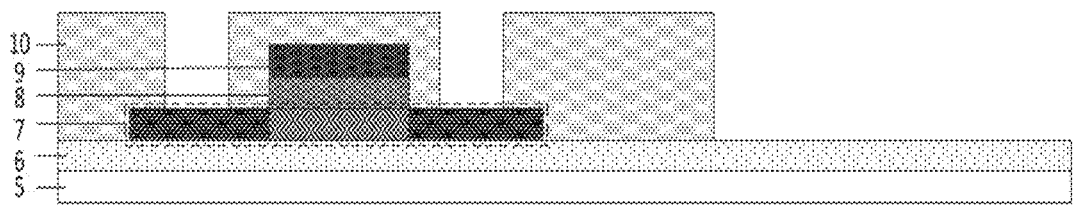
Figure 8E:
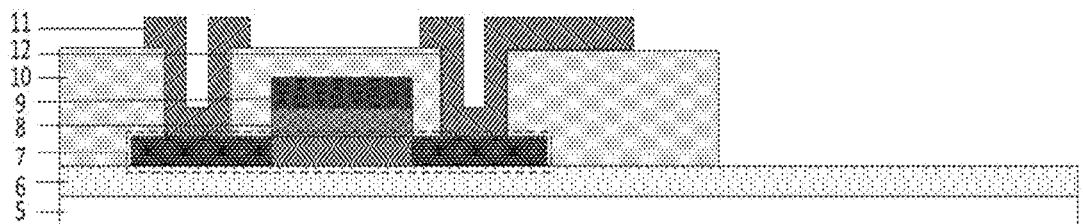

According to another exemplary embodiment, there is provided a method for manufacturing a display panel. FIG. 7 illustrates a flow chart of the method manufacturing a display panel in accordance with an exemplary embodiment. The display panel comprises a pixel unit, the pixel unit comprises a plurality of sub-pixel units. The sub-pixel unit includes at least one transparent film layer and is divided into a light-emitting area and a light-transmitting area, and the quantity of the transparent film layers in the light-transmitting area is smaller than the quantity of the transparent film layers in the light-emitting area. The steps of the method are detailed below. First, a base substrate such as the first base substrate 5 is provided (step S101). Then, on the first base substrate 5, a buffer layer 6 is formed, for example, by depositing an entire layer of buffer layer material (step S102). FIG. 8A shows a cross-sectional view of the first base substrate 5 on which the buffer layer 6 is formed. The buffer layer can be formed, for example, by a deposition process. The material of the buffer layer has been previously described, and will not be described again here. Then, a thin film transistor is formed over the buffer layer (i.e., on a side of the buffer layer facing away from the first base substrate) (step S103). The thin film transistor can be formed, for example, by the following process. First, an active layer material is deposited on the buffer layer 6, and a patterned active layer 7 is formed by a patterning process. FIG. 8B shows the first substrate on which the active layer 7 is formed. Then, the gate insulating layer material and the gate material are successively deposited, and the pattern of the gate electrode 9 and the pattern of the gate insulating layer 8 are formed by a self-aligned process. The segment of the active layer 7 corresponding to the gate insulating layer 8 will be used as the channel region 28. After the gate electrode 9 and the gate insulating layer 8 are formed, the portion of the active layer 7 beside the channel region 28 is conductorized to form a conductive region by a plasma dry etching process. FIG. 8C shows a cross-sectional view of the first substrate on which the active layer 7, the gate insulating layer 8, and the gate electrode 9 are formed. The interlayer insulating layer material is then deposited and etched to form an interlayer insulating layer 10 including via holes. The via holes expose the conductive regions of the active layer 7. In some exemplary embodiments, the interlayer insulating layer material located in the light-transmitting area 3 is etched away. FIG. 8D shows a cross-sectional view of the first substrate after the interlayer insulating layer 10 is formed. Then, the source and drain materials are deposited on the interlayer insulating layer 10 and patterned to form the source 11, drain 12, and the pattern of the signal traces, and pixel capacitor plates (omitted in the drawings). FIG. 8E shows a cross-sectional view of the first substrate after forming the source and drain. At this point, the thin film transistor has been basically formed.

Figure 8F:
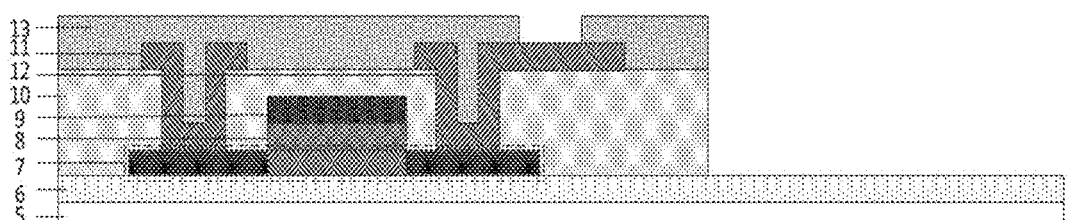
Figure 8G:
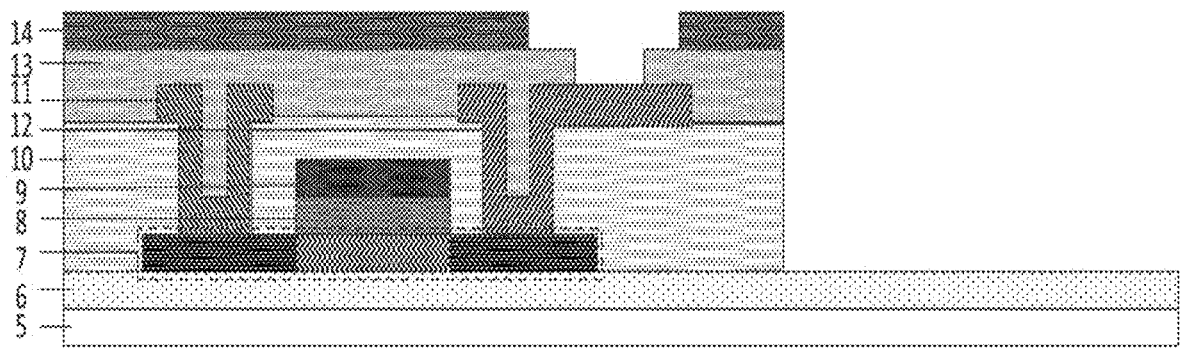

After the thin film transistor is formed, an electroluminescent device and a pixel defining layer defining the light-emitting area are formed over the thin film transistor. The first protective layer 13 and the planarization layer 14 are formed before the formation of the electroluminescent device. Specifically, the first protective layer material is firstly deposited on the interlayer insulating layer and the source and drain and etched to form a via hole exposing the drain 12, thereby obtaining the first protective layer 13 (step S104). The first protective layer material in the light-transmitting area can be removed. FIG. 8F shows a cross-sectional view of the first substrate on which the first protective layer 13 is formed. Then, a layer of planarization layer material is coated and patterned to form a planarization layer 14 having via holes (step S105) which expose the drain 12. The planarization layer material in the light-transmitting area can be removed. FIG. 8G shows a cross-sectional view of the first substrate on which the planarization layer 14 is formed.

After the first protective layer 13 and the planarization layer 14 are formed, an electroluminescent device will be formed.

Figure 8H:
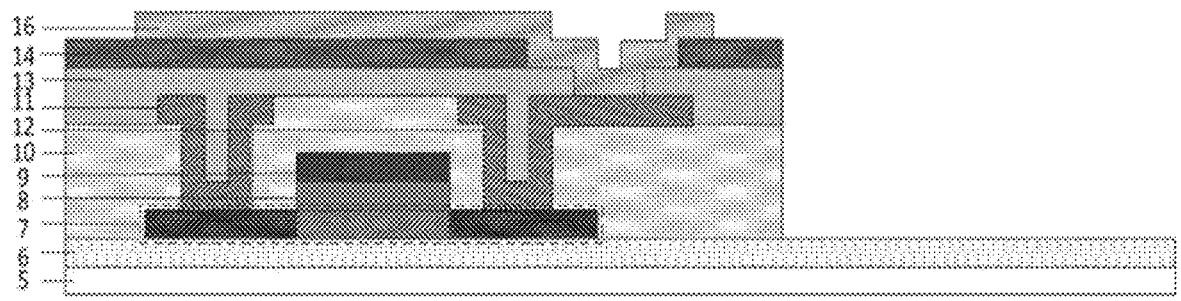
Figure 8I:
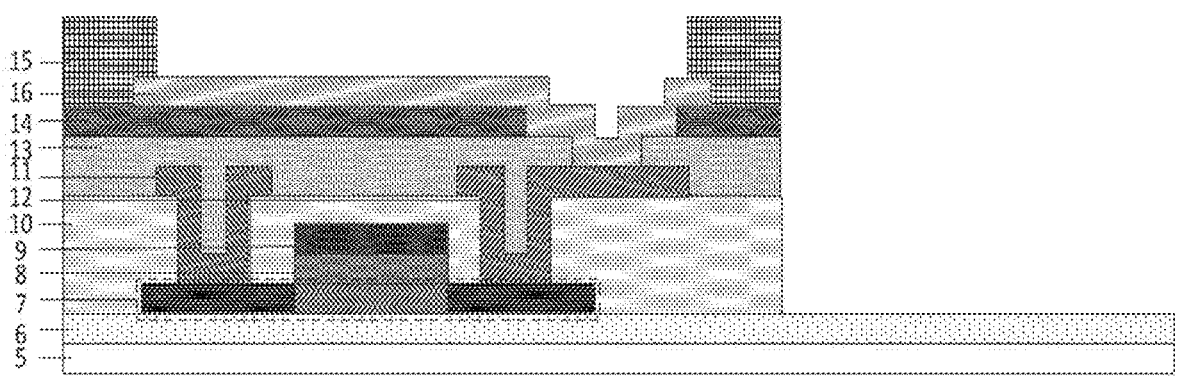

Specifically, firstly, the anode material is deposited and patterned to form the anode 16. The anode 16 is connected to the drain 12 through the via holes in the first protective layer 13 and the planarization layer 14. The anode 16 can be reflective. FIG. 8H shows a cross-sectional view of the first substrate on which the anode 16 is formed. Then, before forming the light-emitting layer of the electroluminescent device, the pixel defining layer is formed. Specifically, the pixel defining layer material is coated and patterned, and the light-emitting area is defined by the patterned pixel defining layer material (i.e., the pixel defining layer 15) (step S106), and the light-transmitting area does not contain any pixel defining layer material. FIG. 8I shows a cross-sectional view of the first substrate on which the pixel defining layer 15 is formed.

Figure 8J:
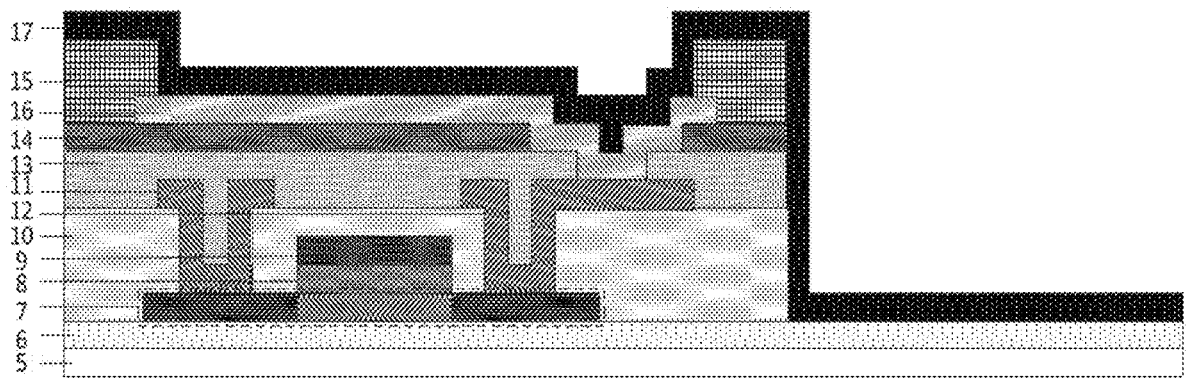
Figure 8K:
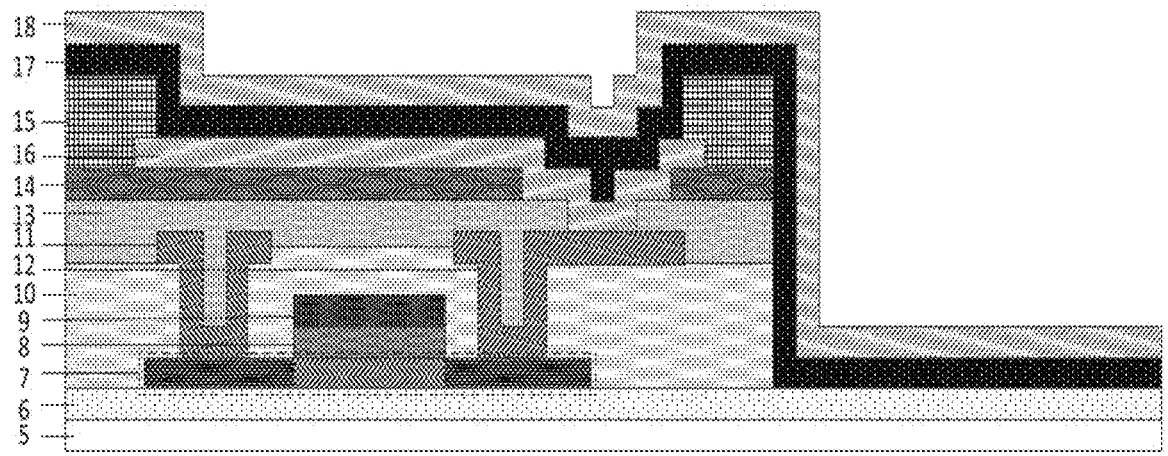

After the pixel defining layer 15 is formed, a light-emitting layer and a transparent electrode of the electroluminescent device are formed (step S107). First, organic layers in the light-emitting layer 17 are formed by for example evaporation. The light-emitting layer 17 can cover both the light-emitting area 2 and the light-transmitting area 3, and covers the light-emitting areas of all sub-pixels. In order to increase the light transmittance, the light-emitting layer 17 may also cover only the light-emitting area without covering the light-transmitting area. The light-emitting layer 17 may include, for example, a hole injection layer, a hole transport layer, a light-emitting material layer, an electron injection layer, an electron transport layer, and the like. FIG. 8J shows a cross-sectional view of the first substrate after the light-emitting layer 17 is formed. Then, an entire layer of transparent cathode material is deposited on the light-emitting layer 17. The transparent cathode 18 can cover only the light-emitting area or cover both the light-emitting area and the light-transmitting area.

In the above steps, at least one of the buffer layer, the interlayer insulating layer, the first protective layer, the planarization layer, the pixel defining layer, and the light-emitting layer is required to be confined to the light-emitting area and excluded from the light-transmitting area. That is to say, when forming some or all of these layers, it is required to form them only in the light-emitting area, and not in the light-transmitting area. For a transparent film layer that exists only in the light-emitting area, it can be realized by firstly forming a whole layer structure in the light-emitting area and the light-transmitting area, and then removing the structure in the light-transmitting area.

It should be noted that the transparent film layer in the transparent display panel may include, for example, a buffer layer, a light-emitting layer, a transparent cathode, and insulating layers. The insulating layer may include, for example, a gate insulator, an interlayer insulating layer, a protective layer, and a planarization layer. Specifically, for each transparent film layer, for example, it can be formed by depositing an entire layer of transparent film layer material and then removing the portion of the layer in the light-transmitting area. What kind of transparent film layer is retained in the light-transmitting area can be selected according to the actual process.

Figure 9:
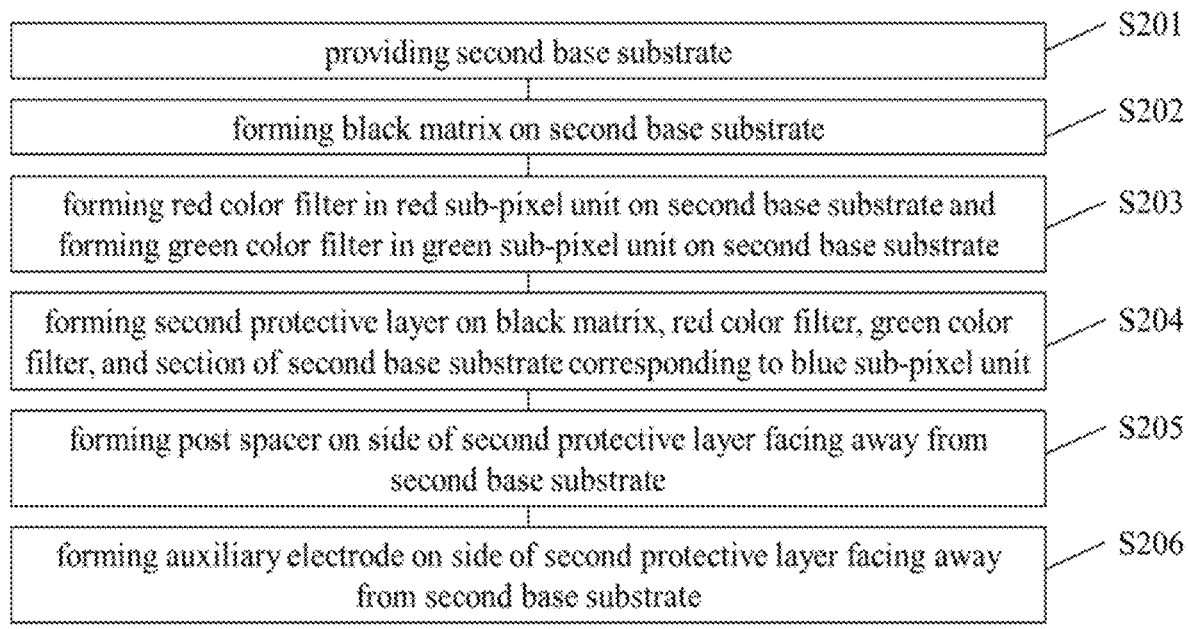
FIG. 9 schematically shows a flow chart of a method for manufacturing a display panel according to another exemplary embodiment.
Figure 10A:
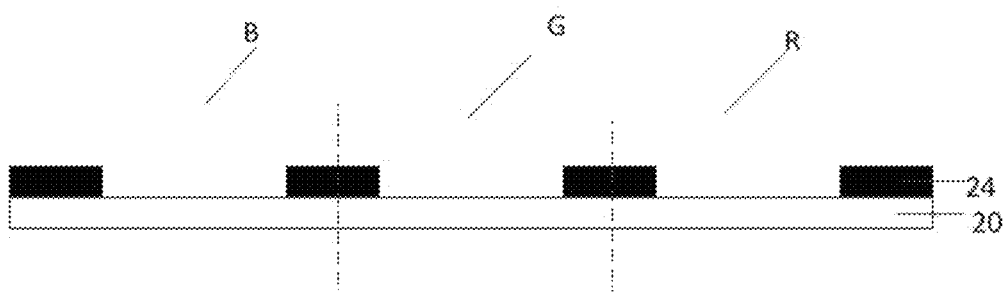
FIGS. 10A-10E schematically show the intermediate structures of the second substrate in a process of manufacturing the display panel according to an exemplary embodiment.
Figure 10B:
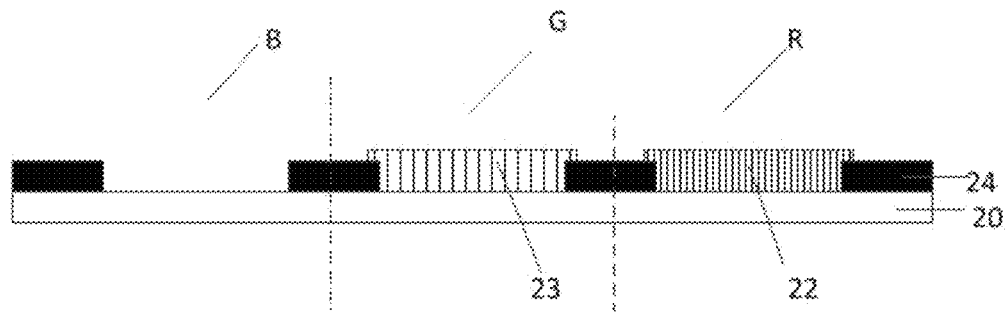

FIG. 9 illustrates another flow chart of the method for manufacturing a display panel in accordance with an exemplary embodiment. The display panel comprises a pixel unit, and the pixel unit comprises a plurality of sub-pixel units. The plurality of sub-pixel units includes a red sub-pixel unit, a blue sub-pixel unit, and a green sub-pixel unit. The light-emitting layers of the plurality of sub-pixel units are blue light-emitting layers. The red sub-pixel unit includes a red color filter, the green sub-pixel unit includes a green color filter, and the blue sub-pixel unit lacks a color filter, i.e., the blue sub-pixel unit does not have a color filter. The method further comprises the steps of forming the second substrate and assembling the first substrate and the second substrate. Firstly, the second base substrate 20 is provided (step S201), and then a black matrix 24 is formed on the second base substrate 20 (step S202). FIG. 10A shows the second substrate formed thereon a black matrix. Then, a color filter is formed on the second base substrate. Specifically, the red color filter 22 is formed on the second base substrate 20 and in the red sub-pixel unit, and the green color filter 23 is formed on the second base substrate 20 and in the green sub-pixel unit, wherein the red color filter 22 and the green color filter 23 are arranged in the same layer as the black matrix 24 (step S203). FIG. 10B shows a cross-sectional view of the second substrate formed thereon a red color filter and a green color filter. The color filter may be a quantum dot color filter. The red color filter is located in the light-emitting area of the red sub-pixel unit, and the green color filter is located in the light-emitting area of the green sub-pixel unit.

In another exemplary embodiment, the light-emitting layer of the first substrate is a white light-emitting layer, and the step of forming the second substrate further comprises forming a blue color filter in the blue sub-pixel unit. The blue color filter is located in the light-emitting area of the blue sub-pixel unit.

Figure 10C:
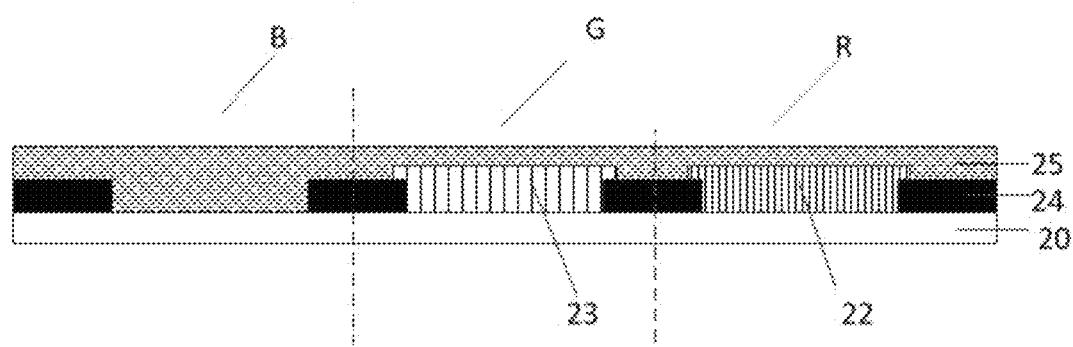
Figure 10D:
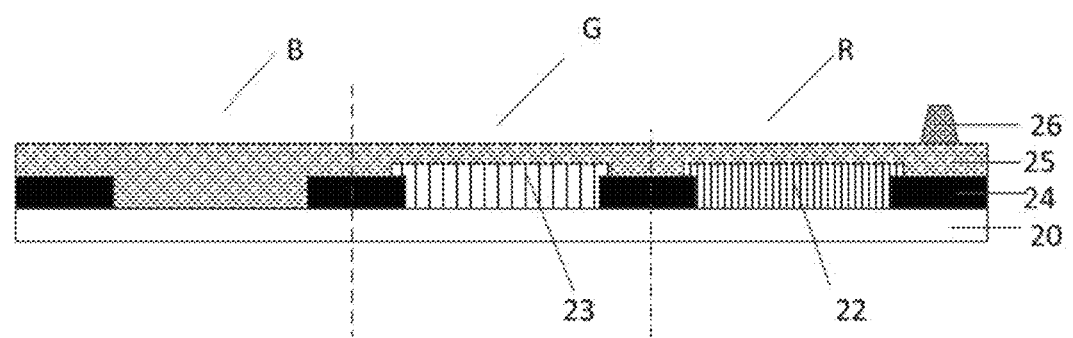
Figure 10E:
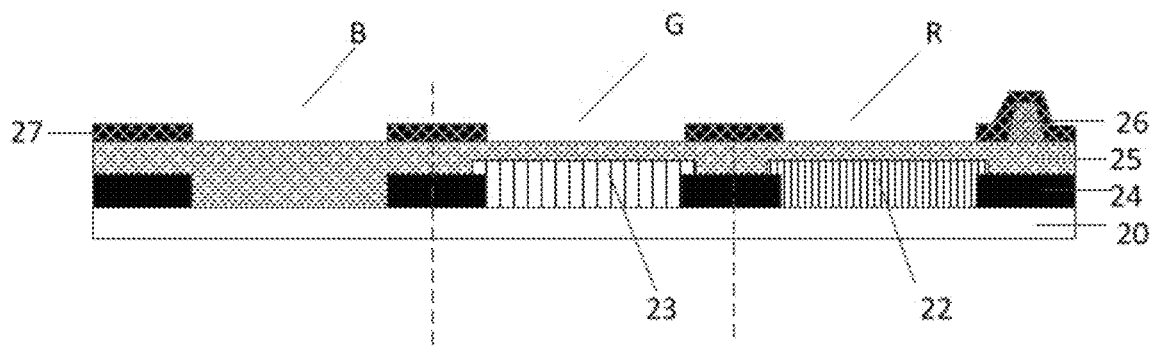

After forming a color filter on the second base substrate, the method further includes coating the protective layer material across the entire surface of the second base substrate to form the second protective layer. Specifically, the second protective layer is formed on the black matrix, the red color filter, the green color filter, and segment of the second base substrate in the blue sub-pixel unit (step S204). FIG. 10C shows a cross-sectional view of the second substrate after the second protective layer 25 is formed. Then, a post spacer is formed on the second protective layer (step S205). The post spacer 26 is used to protrude the auxiliary electrode subsequently deposited thereon to cause the auxiliary electrode to contact the transparent cathode of the first substrate. FIG. 10D shows the second substrate formed thereon the post spacer 26. Then, an auxiliary electrode is formed on the second protective layer (step S206). This step can be achieved by depositing an auxiliary electrode material. FIG. 10E shows a cross-sectional view of the second substrate on which the auxiliary electrode 26 is formed. The same mask can be used to form the auxiliary electrode and the black matrix.

In summary, the present application provides a display panel comprising a pixel unit. The pixel unit comprises a plurality of sub-pixel units, each of the plurality of sub-pixel units comprises at least one transparent film layer, and the sub-pixel unit is divided into a light-emitting area and a light-transmitting area. The quantity of the transparent film layers in the light-transmitting area is less than the quantity of transparent film layers in the light-emitting area. Therefore, the display panel according to the present disclosure excludes at least a part of the transparent film layer appearing in the light-transmitting area in the related art, thereby improving the transmittance of the light-transmitting area. Moreover, the reduction of the quantity of the transparent film layers in the light-transmitting areas in the present application does not affect the luminous efficiency of the light-emitting area, that is, the transparent display panel provided by embodiments can improve the transmittance of the light-transmitting areas without affecting the luminous efficiency of the light-emitting area. The transmittance and the transparency of the transparent display panel can be improved without affecting the luminous efficiency, therefore improve the display effect and enhancing the user experience.

As will be apparent to those skilled in the art, many different ways of performing the methods of the embodiments are possible. For example, the order of the steps can be changed, or some steps can be performed in parallel. In addition, other method steps can be inserted between the steps. The inserted step may represent for example an improvement of the method described herein, or may be independent of the method. Also, a step may not have been fully completed before the next step begins.

It will be appreciated that the above embodiments have been described only by way of example. While embodiments have been illustrated and described in detail in the drawings and foregoing description, such illustration and description are to be considered illustrative or exemplary and not restrictive, and the application is not limited to the disclosed embodiments. In addition, it should be understood that the elements are not necessarily drawn to scale. The dimensions shown in the figures do not indicate the actual dimensions or relative dimensions of the various elements.

Other variations to the disclosed exemplary embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope. The use of the terms such as first, second and similar words do not denote any ordering. These words will be interpreted as names.

We claim:

1. A display panel, comprising a pixel unit, the pixel unit comprising a plurality of sub-pixel units, each of the plurality of sub-pixel units comprising at least one transparent film layer, the at least one transparent film layer comprises:
   a buffer layer on a first base substrate,
   an interlayer insulating layer in a thin film transistor on a side of the buffer layer facing away from the first base substrate,
   a first protective layer on a side of the interlayer insulating layer facing away from the buffer layer,
   a planarization layer on a side of the first protective layer facing away from the interlayer insulating layer,
   a pixel defining layer on a side of the planarization layer facing away from the first protective layer, wherein the pixel defining layer defines a light-emitting area, and a light-emitting layer and a transparent electrode of an electroluminescent device on a side of the thin film transistor facing away from the first base substrate, wherein the electroluminescent device is electrically connects to the thin film transistor and the transparent electrode is on a side of the light-emitting layer facing away from the thin film transistor, wherein each of the plurality of sub-pixel units is divided into the light-emitting area and a light-transmitting area, and the quantity of the transparent film layer in the light-transmitting area is smaller than the quantity of the transparent film layer in the light-emitting area, wherein the interlayer insulating layer, the first protective layer, the planarization layer and the pixel defining layer are confined to the light-emitting area and excluded from the light-transmitting area, and the transparent electrode, the light-emitting layer and the buffer layer are disposed in both of the light-emitting area and the light-transmitting area, wherein at least a part of the plurality of sub-pixel units further comprises a color filter in the light-emitting area, wherein the plurality of sub-pixel units comprises a red sub-pixel unit, a blue sub-pixel unit, and a green sub-pixel unit, the light-emitting layers of the plurality of sub-pixel units are blue light-emitting layers, the red sub-pixel unit comprises a red color filter, the green sub-pixel unit comprises a green color filter, and the blue sub-pixel unit lacks a color filter.

2. The display panel of claim 1, wherein the red color filter comprises a red light quantum dot color filter and the green color filter comprises a green light quantum dot color filter.

3. The display panel of claim 1, wherein the pixel unit further comprises:
- a second base substrate on which the color filter is disposed,
- a black matrix disposed on a same layer with the color filter, wherein the black matrix and the color filter are disposed on a same side of the second base substrate,
- a second protective layer on a side of the second base substrate facing the first base substrate, wherein the second protective layer covers the black matrix and the color filter,
- a post spacer on a side of the second protective layer facing the first base substrate, and
- an auxiliary electrode on a side of the second protective layer facing the first base substrate, wherein the auxiliary electrode covers the post spacer and is electrically connected to the transparent electrode.

4. A display device, comprising the display panel of claim 1.

* * * * *